United States Patent
Norris et al.

(10) Patent No.: US 7,929,927 B2
(45) Date of Patent: Apr. 19, 2011

(54) ADAPTIVE PRE-DISTORTION WITH INTERFERENCE DETECTION AND MITIGATION

(75) Inventors: George B. Norris, Gilbert, AZ (US); Jau Horng Chen, Chandler, AZ (US); Claudio G. Rey, Tempe, AZ (US); Joseph Staudinger, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 790 days.

(21) Appl. No.: 11/927,241

(22) Filed: Oct. 29, 2007

(65) Prior Publication Data

US 2009/0111399 A1   Apr. 30, 2009

(51) Int. Cl.
*H04B 1/04* (2006.01)
*H03C 1/62* (2006.01)

(52) U.S. Cl. .............. 455/114.3; 455/114.2; 455/115.1

(58) Field of Classification Search ............. 455/91, 455/114.3, 114.2, 115.1, 126, 127.2; 375/297, 375/295

See application file for complete search history.

(56) References Cited

U.S. PATENT DOCUMENTS 6,476,670 B1 * 11/2002 Wright et al. ................ 330/2
7,129,777 B2 * 10/2006 Kim et al. ................ 330/149
7,561,636 B2 * 7/2009 Song et al. ................ 375/297
7,583,754 B2 * 9/2009 Liu ................ 375/297
7,672,397 B2 * 3/2010 Irscheid et al. ................ 375/297

OTHER PUBLICATIONS

Hietala, A., A Quad-Band 8PSK/GMSK Polar Transceiver, IEEE Journal of Solid-State Circuits, Vo. 41, No. 5, May 2006.
Muhonen, K., et al., Look-Up Table Techniques for Adaptive Digital Predistortion: A Development and Comparison, IEEE Transactions on Vehicular Technology, vol. 49, No. 5, Sep. 2000.
Altera Corporation, Digital Predistortion Reference Design, AN-314-1.0 Application Notes, Jul. 2003.

* cited by examiner

*Primary Examiner* — Sonny Trinh
(74) *Attorney, Agent, or Firm* — Ingrassia Fisher & Lorenz, P.C.

(57) ABSTRACT

Embodiments include methods, apparatus, and electronic systems adapted to perform adaptive pre-distortion. Embodiments include combining an input sample with a gain value to generate a pre-distorted data sample, where the gain value is a function of at least one gain entry stored within a gain lookup table. An amplified analog signal is generated from the pre-distorted data sample, and a feedback sample is also generated, which corresponds to an antenna output signal. The antenna output signal includes the amplified analog signal. A difference indicator is generated to reflect a difference between the input sample and the feedback sample, and at least one updated gain value is generated based on a comparison between the difference indicator and at least one previous difference indicator. At least one gain entry within the gain lookup table is updated with the at least one updated gain value.

20 Claims, 5 Drawing Sheets

US 7,929,927 B2

ADAPTIVE PRE-DISTORTION WITH INTERFERENCE DETECTION AND MITIGATION

TECHNICAL FIELD

Embodiments relate to adaptive pre-distortion systems, apparatus, and methods, and more particularly to adaptive pre-distortion that detects and mitigates interference.

BACKGROUND

Some transmitters within electronic systems include devices (e.g., radio frequency (RF) power amplifiers) that add distortion to a signal along the transmit chain. Such devices are referred to as "non-linear" devices when the added distortion is non-linear in nature. Distortion may include, for example, variations in phase differences and/or variations in amplitude differences. For example, one type of non-linearity occurs when the phase between an input signal and a corresponding output signal varies with input signal amplitude. This is generally referred to as amplitude-to-phase distortion (am/pm). Another type of non-linearity occurs when the ratio of output signal amplitude to input signal amplitude varies with input signal amplitude. This is generally referred to as amplitude-to-amplitude distortion (am/am). Significant distortion, left uncompensated for, may result in poor system performance.

Adaptive pre-distortion (APD) systems have been used in the past to compensate for the intrinsic distortion characteristics of non-linear devices. A traditional APD system includes a feedback path from the system output, which provides a feedback signal reflective of the antenna output signal. The APD system generates an error signal, which reflects differences between the transmitter's input signal and the feedback signal. The error signal is used to determine a complementary distortion (e.g., an inverse gain). The complementary distortion is applied to the input signal to generate a "pre-distorted" signal. When the complementary distortion accurately reflects the non-linear distortion produced in the system, the system may converge to an optimal pre-distorted input signal, in which the non-linear distortion is effectively cancelled.

At times, the feedback signal may include an additional component due to an interfering RF signal that has leaked through the device's antenna and into the feedback path. This interference typically is incoherent, and may appear as an additional noise component on top of the actual output signal. For example, another source (e.g., a proximate wireless device, referred to as a "blocker") may transmit an RF signal within the same or and adjacent frequency band, which has sufficient power to leak through the device's antenna. Components of the interfering signal that leak through the antenna may combine with and add a noise-like component to the device's output signal. The noise-like component in the output signal is reflected in the feedback signal, and accordingly is reflected in the APD generated error signal and the complementary distortion that is applied to the input signal. This may compromise the convergence of the APD system to an optimal pre-distorted signal, and may also result in poor spectral performance and degraded link quality. Accordingly, a need exists for APD systems and methods that may provide robust convergence to an acceptable pre-distorted signal, even in the face of significant co-channel interference.

DETAILED DESCRIPTION

Embodiments described herein include methods and apparatus for performing adaptive pre-distortion with interference detection and mitigation. The various embodiments may provide one or more advantages over traditional adaptive pre-distortion systems. For example, embodiments of an adaptive pre-distortion apparatus described herein may provide robust convergence to an acceptable pre-distorted signal, even in the face of significant co-channel or other interference.

Figure 1:
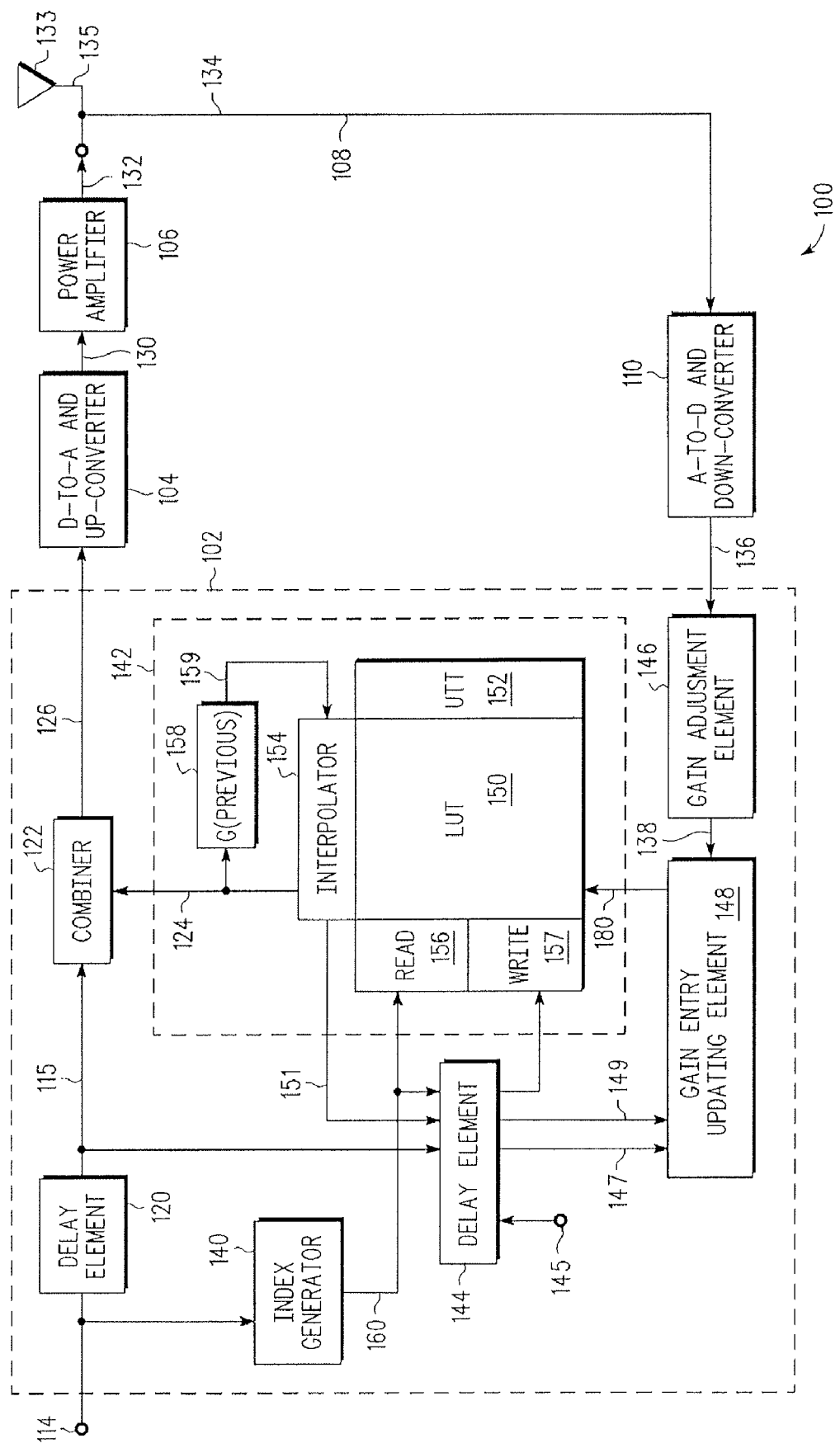
FIG. 1 illustrates a simplified block diagram of an electronic system having an adaptive pre-distortion (APD) apparatus, in accordance with an example embodiment.

FIG. 1 illustrates a simplified block diagram of electronic system 100 having an adaptive pre-distortion (APD) apparatus 102, in accordance with an example embodiment. Electronic system 100 may form a portion of any apparatus that includes an APD apparatus, including but not limited to apparatus that transmit signals over a wireless medium. These apparatus include, but are not limited to, a cellular telephone, a radio, a two-way pager, a personal data assistant, a computer (e.g., a laptop, notebook, desktop, server or mainframe computer), a satellite, a relay, a repeater, a remote control device, a wireless transmitter, and/or a wireless transceiver, to name a few.

Electronic system 100 includes APD apparatus 102, digital-to-analog (D-to-A) converter and up-converter 104 (herein "up-converter 104"), power amplifier 106, feedback path 108, and analog-to-digital (A-to-D) converter and frequency down-converter 110 (herein "down-converter 110"), in an embodiment. These system elements form at least a portion of a transmitter for electronic system 100. Electronic system 100 may include additional system elements (not illustrated) such as, for example, one or more input data sources, receive path system elements, signal processing components, data storage components, and/or user interfaces, to name a few. For purposes of clarity only, these additional system elements are not illustrated in FIG. 1. Further, although FIG. 1 illustrates an APD apparatus 102 used in the context of a transmitter for an electronic system, APD apparatus of various embodiments may alternatively be used in a receiver or transceiver for an electronic system, and/or within other electronic systems that include one or more amplifiers and/or other non-linear devices for which adaptive pre-distortion may be desired. Accordingly, the scope of the inventive subject matter is intended to include APD apparatus used in a variety of different types of systems and components.

APD apparatus 102 receives an input signal that includes multiple input samples 114, X(i). As used herein, the term "input signal" includes a sequence of one or more input samples and/or delayed input samples (e.g., input samples 114, delayed input samples 115, and/or additionally delayed input samples 147). Input samples 114 may include, for example, a sequence of discrete time samples of a signal to be transmitted (e.g., a transmission burst). In an embodiment, input samples 114 include a sequence of complex values represented in Cartesian coordinates, so that each value has a real component (I) and an imaginary component (Q). Accordingly, input samples 114 may include a sequence of values that may be represented as $X(i)=[I(i), Q(i)]$, where i indicates a sample number and $i=1 \ldots N$, $I(i)$ represents a real component of an input sample, and $Q(i)$ represents an imaginary component of an input sample. In alternate embodiments, input samples 114 may include sequences of values represented in polar coordinates or some other representation.

Figure 2:
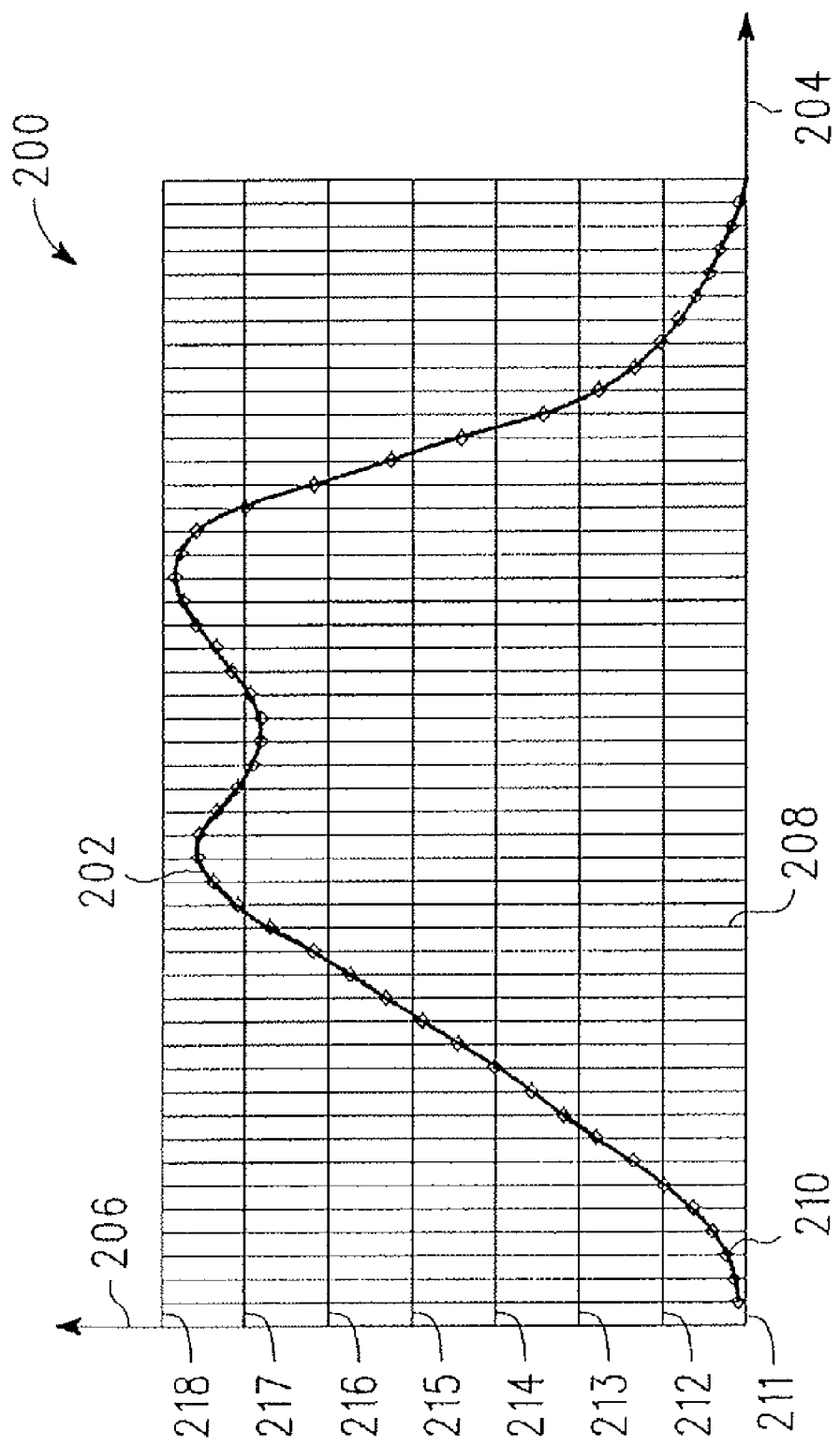
FIG. 2 is a graph illustrating a sampled input signal, in accordance with an example embodiment.

FIG. 2 is a graph 200 illustrating a sampled input signal 202 (e.g., from which input samples 114, FIG. 1 may be determined), in accordance with an example embodiment. Input signal 202 could represent, for example, a signal burst produced using any of a number of technologies, including GSM (Global System for Mobile communications, or Groupe Special Mobile), EDGE (Enhanced Data rates for GSM Evolution), TDMA (Time-Division Multiple Access), CDMA (Code Division Multiple Access), W-CDMA (Wideband CDMA) or some other technology. Graph 200 includes a time axis 204 and a magnitude axis 206, and accordingly variation in the input signal magnitude with respect to time is represented in FIG. 2. For example, magnitude axis 206 could correspond to the vector magnitude of $X(i)$, in an embodiment, although magnitude axis 206 alternatively could correspond to the magnitude of $I(i)$ or $Q(i)$, in other embodiments. Vertical lines 208 indicate sampling moments, and samples 210 are indicated by diamonds along input signal 202. For purposes of illustration, only 48 samples 210 are indicated for input signal 202. In actuality, significantly more samples may be produced (e.g., millions), depending on the sampling rate of the system. Horizontal lines indicate magnitude thresholds 211, 212, 213, 214, 215, 216, 217, 218. As will be described in detail later, each magnitude threshold 211-218 may correspond to an entry within a gain lookup table 150 (FIG. 1).

Referring again to FIG. 1, in an embodiment, APD apparatus 102 includes first delay element 120, combiner 122, index generator 140, gain generator 142, second delay element 144, gain adjustment element 146, and gain entry updating element 148. Gain generator 142 includes gain lookup table 150 (LUT), update tracking table 152 (UTT), interpolator 154, read logic 156, and write logic 157, in an embodiment. In addition, gain generator 142 also may include a previous gain register 158 or a memory location for storing a previous gain, G(previous), as will be described in more detail later.

First delay element 120 is adapted to delay an input sample 114, $X(i)$, by period of time (e.g., a number of clock cycles) corresponding to the amount of time it takes for APD apparatus 102 to generate appropriate gain values 124, $G(i)$, for combination with the delayed input sample 115. Combiner 122 is adapted to combine the delayed input samples 115 with the gain values 124, in order to generate pre-distorted data samples 126, $X_p(i)$. Details regarding generation of gain values 124 will be described in detail in subsequent paragraphs. In an embodiment, each gain value 124 is a function of at least one gain entry stored within gain lookup table (e.g., gain lookup table 150). Each gain value 124 may include a complex value represented in Cartesian coordinates, in an embodiment. For example, a complex gain value 124 may be represented as $G(i)=[G_r(i), G_i(i)]$, where $G(i)$ is a complex gain to be applied to the $k^{th}$ input sample, $X(i)$. $G_r(i)$ represents a real component of the complex gain, and $G_i(i)$ represents an imaginary component of the complex gain. In other embodiments, each gain value 124 may be represented in polar coordinates or some other gain representation. In an embodiment, the combination of the delayed input samples 115 with the gain values 124 (i.e., the pre-distorted data samples 126) may be represented as $X_p(i)=(I(i)+jQ(i)) \times (G_r(i)+jG_i(i))=[I_p(i), Q_p(i)]$. $I_p(i)$ represents the real component of a pre-distorted data sample 126, and $Q_p(i)$ represents an imaginary component of a pre-distorted data sample 126.

An amplified analog signal 132 is generated from the pre-distorted data sample 126. In an embodiment, this is achieved by up-converter 104 and power amplifier 106. Up-converter 104 is adapted to receive and perform a D-to-A conversion of the pre-distorted data samples 126. In an embodiment, up-converter 104 also is adapted to up-convert the analog version of the pre-distorted data samples 126 from a first frequency (e.g., a baseband or intermediate frequency) to a second frequency (e.g., a carrier frequency). In an embodiment, up-converter 104 up-converts the analog version to a radio frequency. Up-converter 104 also may be adapted to perform filtering and/or pre-amplification, in an embodiment. Up-converter 104 generates an up-converted analog signal 130. Power amplifier 106 is adapted to receive and amplify the up-converted analog signal 130, in order to generate an amplified analog signal 132. The amplified analog signal 132 is provided to antenna 133, which may radiate an antenna output signal 135, which includes the amplified analog signal 132, onto the air interface.

During system operations, up-converter 104 and/or power amplifier 106 may introduce a significant amount of non-linearity (i.e., distortion) into the amplified analog signal 132, and may also add additional phase to the signal, which represents a phase rotation of the amplified analog signal 132, with respect to the input signal 114. The distortion produced by up-converter 104 and/or power amplifier 106 may change over time based on a variety of factors. For example, but not by way of limitation, factors affecting distortion may include transmission frequency, modulation scheme, temperature, physical position, and/or transmission power, among other things. As used herein, the term "non-linear device" refers to any device that has intrinsic distortion characteristics such that the device may introduce non-linear distortion into a signal that is processed by the device. Up-converter 104 and power amplifier 106 may be considered non-linear devices, in the illustrated embodiment. One or more other non-linear devices may be present in a transmit path as well, including additional amplifiers, filters, converters, and/or other devices. Distortion may be further exacerbated by the loading of antenna 133 and by processing performed along feedback path 108. In addition, one or more interfering RF signals may leak through antenna 133, and add an additional component to the antenna output signal 135. This interference typically is incoherent, and may appear as an additional noise component on top of the amplified analog signal 132. The term "cumulative signal distortion" refers to the combined distortion that may be applied to a signal by one or more non-linear devices of a system. The term "interference" refers to the signal components that may exist within a signal due to interfering signals from other sources or devices.

Gain generator 142 is adapted to generate a sequence of gain values 124, so that combination of the gain values 124 with the delayed input samples 115 may have the effect of pre-distorting the input samples in a manner that mitigates the distortion produced by one or more non-linear devices (e.g., up-converter 104 and/or power amplifier 106) within system 100. In an embodiment, each gain value 124 is generated based on at least one gain entry stored within gain lookup table 150 (LUT), which will be described in detail later. The gain entries stored within gain lookup table 150 may be initialized and updated, according to various embodiments, so that the gain values 124 generated from the gain entries may accurately compensate for the intrinsic distortion characteristics of the non-linear devices, when the gain values 124 are combined with the delayed input samples 115. In an embodiment, as will be described in detail later, the antenna output signal 135 is fed back (e.g., via feedback path 108), processed and evaluated in order to generate updated values for the gain values within gain lookup table 150. In addition, in an embodiment, interference from other devices may be detected and mitigated during the feedback evaluation and gain value updating processes, in order to reduce the likelihood of performing gain entry updates that reflect the interference. This, in turn, increases the likelihood that the APD system consistently will converge to acceptable pre-distorted signals 126.

To enable processing and evaluation of the antenna output signal 135, feedback path 108 is adapted to provide, to down-converter 110, a feedback signal 134 that represents the antenna output signal 135. In an embodiment, down-converter 110 is adapted to down-convert the feedback signal 134 to the frequency of the input samples 114 (e.g., a baseband or intermediate frequency). Down-converter 110 may be further adapted to perform filtering and/or amplification of the feedback signal 134, as well as performing an A-to-D conversion of the down-converted feedback signal 134. Down-converter 110 generates down-converted feedback samples 136, which may be referred to herein as "feedback samples." As used herein, the term "feedback sample" includes a sequence of one or more feedback samples at various stages of processing (e.g., down-converted feedback samples 136 and/or adjusted feedback samples 138).

In an embodiment, feedback samples 136 include a sequence of complex values represented in Cartesian coordinates. Accordingly, feedback samples 136 may include a sequence of values that may be represented as $X_d(i)=[I_d(i), Q_d(i)]$, where $I_d(i)$ represents a real component of a feedback sample 136, and $Q_d(i)$ represents an imaginary component of a feedback sample 136. In alternate embodiments, feedback samples 136 may include sequences of values represented in polar coordinates or some other representation. In still other embodiments, a system or apparatus may have feedback configurations other than the configuration illustrated in FIG. 1. For example, but not by way of limitation, other embodiments may exclude an up-converter/down-converter in the feedback path, and/or other configurations may include more, fewer or different elements in the feedback loop than up-converter 104, power amplifier 106, and down-converter 110.

Feedback samples 136 are received by gain adjustment element 146, in an embodiment. Gain adjustment element 146 is adapted to apply an adjustment gain to the feedback samples 136, $X_d(i)$, in order to substantially remove, from the feedback signal, various predictable gains that may have been applied along the transmit path. In an embodiment, an "adjustment gain" may be defined as an inverse of one or more gains applied along the transmit path, which have values that are known in advance by the system (e.g., gains applied by power amplifier 106 to control transmit power). The adjustment gains may include a sequence of values that may be represented as $<S>^{-1}=<S_r(i)+jS_i(i)>^{-1}$, where $S_r(i)$ represents a real component of an adjustment gain, and $S_i(i)$ represents an imaginary component of an adjustment gain. In alternate embodiments, adjustment gains may include sequences of values represented in polar coordinates or some other representation. Application of the adjustment gains to the feedback samples 136 generates adjusted feedback samples 138, $X_{adj}(i)$. In an embodiment, gain adjustment element 146 also may be adapted to apply phase rotations to the adjustment gain, under some circumstances. In an embodiment in which feedback samples 136 are represented in polar coordinates, rather than Cartesian coordinates, gain adjustment element 146 may adjust a magnitude and a phase of each feedback sample 136 using appropriate polar coordinate operations.

Gain entry updating element 148 is adapted to evaluate the adjusted feedback samples 138 in the process of determining updated gain values 180 for the gain entries of gain lookup table 150. In the process of determining updates to the gain entries of gain lookup table 150, gain entry updating element 148 is adapted to determine an error vector, E(i), as a function of a delayed input sample 147, X(i), and the corresponding adjusted feedback sample 138, $X_{adj}(i)$ (e.g., the difference between the delayed input sample 147 and the corresponding adjusted feedback sample 138). When the error vector does not reflect significant interference from other devices, the system may converge fairly quickly. However, when the error vector does reflect significant interference, the system may converge more slowly or may not converge at all, if that interference is left unmitigated and reflected in the gain entries within the gain lookup table 150. As will be described in more detail below, gain entry updating element 148 is adapted to detect significant interference, in an embodiment, and to mitigate that interference by affecting the updating of the gain entries within gain lookup table 150. In an embodiment, updated gain values 180 for the gain entries of gain lookup table 150 are calculated differently when significant interference is detected in the adjusted feedback samples 138. After a brief description of the gain lookup table 150 and how it is used within the system 100, the process of initializing and updating the gain entries of the gain lookup table 150 based on the error vector, E(i), will be described in more detail.

Gain lookup table 150 includes a plurality of gain entries, LUT(1 ... N), where each "gain entry" represents a gain value that may be applied, either alone or in combination with one or more other gain entries (and or one or more previous gain values) to an input sample (e.g., delayed input sample 115). In an embodiment, the number of gain entries within gain lookup table 150, N, may be in a range from 4 to 32, although gain lookup table 150 may include more or fewer gain entries, in other embodiments. The number of gain entries, N, may be a static number or may be variable, in various embodiments. Each gain entry, LUT(n), within gain lookup table 150 may include a complex gain value represented in Cartesian coordinates. For example, a complex gain value within gain lookup table 150 may be represented as $LUT(n)=[LUT_r(n), LUT_i(n)]$, where LUT(n) is a complex gain value, n is an index into the gain lookup table, and n=1 ... N. $LUT_r(n)$ represents a real component of the complex gain value, and $LUT_i(n)$ represents an imaginary component of the complex gain value. In other embodiments, each gain entry may include a gain value represented in polar coordinates or some other gain representation. In still other embodiments, a gain lookup table may be adapted to store a first value (e.g., an initial value) and a delta value for each gain entry, rather than a complex gain value. In such an embodiment, the system may maintain the first value and may change the delta value when a particular entry is being updated. To perform pre-distortion, the first value and the delta value may be combined with an input sample (e.g., delayed input sample 115, FIG. 1). In still another embodiment, such as one that includes a gain lookup table with gain entries represented in polar coordinates (e.g., magnitude and phase), the gain lookup table may include one or more magnitude and phase values stored therein.

Interpolator 154 is adapted to calculate the gain value 124, G(i), which will be combined with the delayed input sample 115, X(i). In various embodiments, interpolator 154 is adapted to generate the gain value 124, G(i), by performing a weighted interpolation process using a weighting factor, w(i) and gain lookup table gains stored within two consecutive gain lookup table entries, where the weighting factor may be determined based on an index 160, i(i), which is generated by index generator 140. In an embodiment, interpolator 154 also may calculate a gain value 124, G(i), using a previously generated gain 159, G(previous), which may be stored in previous gain register 158 or a memory location. In an embodiment, the previously generated gain 159, G(previous), is a gain value 124 that was generated for a "last" input sample, or G(previous)=G(i−1). In other embodiments, the previously generated gain 159, G(previous), may be a gain value 124 generated for some other, earlier input sample, or may be a value derived from multiple, previously generated gain values 124 (e.g., an average or weighted average of multiple previously generated gain values 124). The processes of generating an index 160, i(i), and calculating a gain value 124, G(i), are described in detail in the next paragraphs.

Upon receipt of an input sample 114 (e.g., an $i^{th}$ input sample), index generator 140 may generate an index 160, i (i), into gain lookup table 150 for that input sample. In various embodiments, the generated index may be determined based on, for example, the vector magnitude of X (i), or the vector magnitude squared of X (i) for an input sample 114. For purposes of explanation, the description below refers to generating the index based on a magnitude of X (i). An index 160 into gain lookup table 150 includes a fixed point number, in an embodiment, and accordingly has an integer part, $i_{INT}$(i), and a fractional part, $i_{FRAC}$ (i). Upon receipt of an input sample 114, X (i), index generator 140 may determine the index 160 as a scaled version of the sample's magnitude (e.g., a scaled version of X (i)), for example.

When received by read logic 156 of gain generator 142, the integer part, $i_{INT}$(i), of the gain lookup table index 160 may be evaluated to determine two consecutive gain entries within gain lookup table 150: a "floor" entry, LUT($n_{floor}$); and a "ceiling" entry, LUT($n_{ceil}$). In an embodiment, the two consecutive gain entries may be selected as LUT($n_{floor}$)=LUT($i_{INT}$(i)) and LUT($n_{ceil}$)=LUT($i_{INT}$(i)+1). As mentioned previously, interpolator 154 may perform a weighted interpolation process, in an embodiment, using a weighting factor, w(i), the gain values stored within the floor entry, LUT($n_{floor}$), and the ceiling entry, LUT($n_{ceil}$), and a previous gain value 159, G(previous), in order to generate the gain value 124, G(i).

It is desirable that the gain entries, LUT(n), within gain lookup table 150, include gain values that accurately reflect the cumulative signal distortion produced by up-converter 104, power amplifier 106, and/or other non-linear devices that may add distortion to the signal. Because the cumulative signal distortion may not be known with accuracy at the beginning of some transmissions (e.g., at the beginning of a series of bursts), the gain entries may be initialized, in an embodiment. In addition, because the cumulative signal distortion may change over time, the gain values are updated over time to continue to accurately reflect the cumulative signal distortion, in an embodiment. Accordingly, the gain entries include adaptive gain values, and the system provides adaptive pre-distortion. Along with the desirability that the gain entries, LUT(n), adaptively reflect the cumulative signal distortion, it is also desirable that the gain entries do not reflect received interference, or only minimally reflect such interference. Accordingly, in embodiments that will be described in detail below, the process of updating the gain entries is affected when significant interference is detected.

As mentioned above, in an embodiment, gain generator 142 includes an update tracking table 152 (UTT). Update tracking table 152 is adapted to store update tracking information, and includes a plurality of entries, UTT(1 ... N), where each entry corresponds to a gain entry within gain lookup table 150, in an embodiment. Accordingly, LUT(1) corresponds to UTT(1), and so on. Update tracking information stored within an entry of update tracking table 152 may indicate whether a corresponding gain entry within gain lookup table 150 has been previously updated, in an embodiment. For example, when an update tracking table entry, UTT(n), includes a value of zero, it may indicate that the corresponding gain entry, LUT(n), has not been previously updated, and when the update tracking table entry, UTT(n), includes a non-zero value, it may indicate that the corresponding gain entry, LUT(n), has been previously updated. Other values may be used to indicate whether or not a gain entry has or has not been updated, in other embodiments. In a further embodiment, a value stored within an update tracking table entry, UTT(n), may indicate how many times the corresponding gain entry, LUT(n), has been updated. In another embodiment, the information within update tracking table 152 may be incorporated into gain lookup table 150 (e.g., each gain entry may include update tracking information). In still another embodiment, the information within update tracking table 152 may be excluded altogether from gain generator 142.

As mentioned briefly above, initialization and updating of the gain entries within gain lookup table 150 primarily may be performed by gain entry updating element 148, in an embodiment. Initialization of the gain entries within gain lookup table 150 may include setting one or more gain entries to initial values. Updating of the gain entries within gain lookup table 150 includes the process of generating updated gain values 180, which may more accurately reflect the actual cumulative signal distortion produced through portions of the system 100. As will be described in more detail later, generation of updated gain values 180 is based on analysis of actual signals being processed by the system 100, rather than training sequences, as is used in some traditional systems. In addition, as will be described later, updating of the gain entries within gain lookup table 150 may be modified, in an embodiment, during times when the system determines that significant interference is present within the antenna output signal 135 (and thus feedback signal 134).

In an embodiment, second delay element 144 receives a delayed input sample 115 and one or more gain entries (e.g., floor and ceiling gain entries, LUT($n_{floor}$), LUT($n_{ceil}$)) that were used to generate gain value 124. Second delay element 144 is adapted to generate additionally delayed input samples 147 and delayed gain values 149, by delaying the delayed input samples 115 and the gain entries 151 (e.g., LUT($n_{floor}$)(i) and LUT($n_{ceil}$)(i)) for an amount of time (e.g., a number of clock cycles) indicated in a delay signal 145. In an embodiment, this may result in synchronization of a delayed input sample 115 and the gain entries with generation of a corresponding adjusted feedback sample 138 (e.g., an amount of time that allows the delayed input sample 115 to be pre-distorted, up-converted, amplified, fed back, down-converted, and gain-adjusted by the system). Accordingly, second delay element 144 enables gain entry updating element 148 to link a delayed input sample 115 with its corresponding adjusted feedback sample 138 and the gain entries used to calculate the gain value 124 that was applied to the delayed input sample 115. Second delay element 144 also may receive and delay the weighting factor, w(i), and/or the lookup table index 160, i(i), corresponding to the delayed input sample 115.

Figure 3:
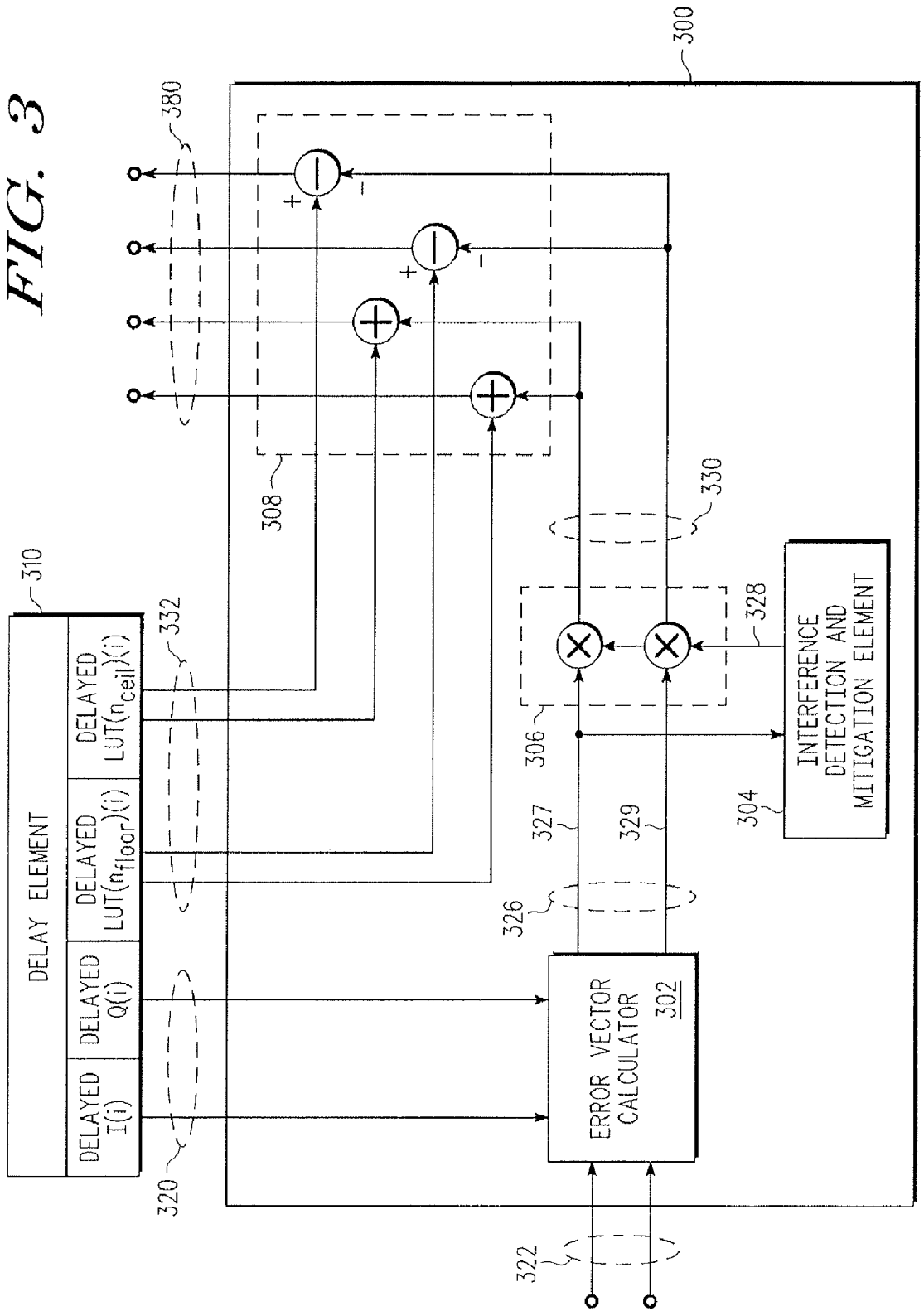
FIG. 3 illustrates a simplified block diagram of a gain entry updating element, in accordance with an example embodiment.

FIG. 3 illustrates a simplified block diagram of a gain entry updating element 300 (e.g., gain entry updating element 148, FIG. 1), in accordance with an example embodiment. As mentioned above, gain entry updating element 300 is adapted to update the gain entries within the gain lookup table (e.g., gain lookup table 150, FIG. 1). Although gain entry updating element 300 also may perform the process of initializing the gain values within the gain lookup table, this process is not discussed in detail herein.

In an embodiment, gain entry updating element 300 receives a delayed input sample 320 (e.g., delayed input sample 147, FIG. 1) and at least one delayed gain value 332 (e.g., delayed gain value 149, FIG. 1) from a delay element 310 (e.g., delay element 144, FIG. 1). A delayed input sample 320 may be a complex value, as described previously, such as a value represented by a real component, I(i), and an imaginary component, Q(i). The at least one delayed gain value 332 may include the values of floor and ceiling gain entries, LUT($n_{floor}$), LUT($n_{ceil}$), which were used to calculate the gain value (e.g., gain value 124, FIG. 1) that was applied to the delayed input sample 320 (e.g., delayed input sample 115, FIG. 1), in an embodiment. Along with a delayed input sample 320 and at least one delayed gain value 332, gain entry updating element 300 also receives a feedback sample 322 (e.g., feedback sample 138, FIG. 1) that corresponds to the delayed input sample 320. The feedback sample 322 also may be a complex value, as discussed previously. Gain entry updating element 300 generates updated gain values 380 (e.g., updated gain values 180, FIG. 1) based on these received values, and the updated gain values 380 are used to replace, within the gain lookup table (e.g., gain lookup table 150, FIG. 1), the current values within at least one gain entry (e.g., the current values of floor and ceiling gain entries, LUT($n_{floor}$), LUT($n_{ceil}$)). In an embodiment, the updated gain values 380 may be generated based on interference that may be detected by gain entry updating element 300 (or more specifically interference detection and mitigation element 304), as will be described in detail below.

In an embodiment, gain entry updating element 300 includes error vector calculator 302, interference detection and mitigation element 304, combiner 306, and updated gain value calculator 308. Error vector calculator 302 is adapted to receive delayed input samples 320 (e.g., delayed input samples 147, FIG. 1) and feedback samples 322 (e.g., adjusted feedback samples 138, FIG. 1), and to calculate "difference indicators," which include values that reflect differences between delayed input samples 320 and the feedback samples 322. As used herein, "a difference indicator" means a value that reflects a difference between an input sample and a feedback sample, such as an error vector 326, a portion of an error vector 326 (e.g., a real component 327 or an imaginary component 329 of an error vector 326) or some other value (e.g., a value that is not represented as a vector) that reflects a difference between these two quantities.

In an embodiment, error vector calculator 302 also may include a rotation element (not illustrated) adapted to phase rotate the input samples 320 and/or the feedback samples 322 prior to calculating the differences, although this is not required. For example, error vector calculator 302 may include a phase rotation element, such as a CORDIC or dual CORDIC device, which may phase rotate the input samples 320 and feedback samples 322 by substantially equal angles of rotation. In an embodiment, the rotation angle applied to the input samples 320 and the feedback samples 322 may approximately equal the negative of the phase component of the input samples 320. Accordingly, error vector calculator 302 may be adapted to rotate the input samples 320 and the feedback samples 322 by rotation angles that substantially remove the phase components of the input samples 320.

The difference calculator (not illustrated) is adapted to receive the input samples 320 (or the rotated, delayed input samples) and the feedback samples 322 (or the rotated feedback samples), and to generate difference indicators (e.g., error vectors 326) that reflect differences between them. In an embodiment, the difference calculator includes a first difference element, which generates values reflecting differences between the real components of the input samples 320 (or the rotated input samples) and the feedback samples 322 (or the rotated feedback samples), and a second difference element, which generates values reflecting differences between the imaginary components of the input samples 320 (or the rotated input samples) and the feedback samples 322 (or the rotated feedback samples). In an embodiment, the error vectors 326 may include a sequence of values represented by $\delta E(i)=[\delta E_r(i), \delta E_i(i)]$, where $\delta E(i)$ is a complex error vector, i is a value number within the sequence, and i=1 ... N. $\delta E_r(i)$ represents a real component 327 of a complex error vector 326, and $\delta E_i(i)$ represents an imaginary component 329 of a complex error vector 326. In an alternate embodiment in which polar coordinate operations are performed, each error vector may be represented as having a magnitude component and a phase component. In still another alternate embodiment, an error value may be calculated, which is not represented by a vector (e.g., the error value is not complex).

In an embodiment, combiner 306 is adapted to receive the error vectors 326, and to combine them with current adjustment factors 328 (also referred to herein as "current μ"), in order to generate at least one gain update value 330. The current adjustment factors 328 are generated by interference detection and mitigation element 304. As will be explained in detail below in conjunction with FIG. 4, interference detection and mitigation element 304 is adapted to detect the presence of significant interference in the feedback signal based on a component of the error vectors 326 (e.g., a real component, as illustrated in FIG. 3 or in other embodiments, an imaginary component or both a real and imaginary component) or some other indicator of the difference between an input signal and a feedback signal, and to mitigate significant interference by generating the current adjustment factors 328 based on the interference. In an embodiment, a current adjustment factor 328 having a nominal value (referred to herein as a "nominal adjustment factor" or "nominal μ") may be combined with an error vector 326 when significant interference is not detected by the interference detection and mitigation element 304, and a current adjustment factor 328 that is less than the nominal value is combined with the error vector 326 when significant interference is detected. In an embodiment, significant interference may be considered to be detected when an evaluation of the error vectors 326 generates a signal to interference indicator (e.g., signal to interference indicator 436, FIG. 4), which indicates that some threshold is exceeded (e.g., signal to interference threshold 440, FIG. 4).

Updated gain value calculator 308 is adapted to combine the at least one gain update value 330 with at least one current value for at least one gain entry 332, where the at least one gain entry corresponds to the at least one gain entry that was used to calculate the gain value (e.g., gain value 124, FIG. 1) that was combined with the input sample (e.g., delayed input sample 115, FIG. 1) that corresponds to the delayed input sample 320 (e.g., delayed input sample 147, FIG. 1). For example, gain value calculator 308 may combine a gain update value 330 with delayed gain entries 332 (e.g., delayed gain entries 149, FIG. 1) corresponding to the floor and ceiling gain entries, LUT($n_{floor}$)(i), LUT($n_{ceil}$)(i), that were used to calculate the gain value (e.g., gain value 124) that was applied to the input sample (e.g., delayed input sample 115, FIG. 1) corresponding to the delayed input sample 320 (e.g., delayed input sample 147, FIG. 1). In an embodiment, updated gain value calculator 308 adds the real components of a gain update value 330 with the real components of the at least one gain entry to generate real components of the updated gain values 380, and subtracts the imaginary components of the gain update value 330 from the imaginary components of the at least one gain entry to generate imaginary components of the updated gain values 380. In an alternate embodiment, updated gain value calculator 308 may perform other mathematical operations to generate the updated gain values 380.

As the above description indicates, the values for the updated gain values 380 are dependent upon the gain update values 330. The values for the gain update values 330, in turn, are dependent upon the values for the current adjustment factors 328. Finally, the values for the current adjustment factors 328 are dependent upon whether or not the interference detection and mitigation element 304 detects significant interference, and the level of that interference, when detected. In an embodiment, the current adjustment factors 328 are reduced below a nominal value in the face of significant interference, which has the effect of reducing the magnitude of the update (e.g., the gain update value 330) that is applied to the gain entries within the gain lookup table (e.g., gain lookup table 150, FIG. 1). Accordingly, the effect of significant interference on gain values stored within the gain lookup table (e.g., gain lookup table 150, FIG. 1) may be mitigated or reduced, using various embodiments, and the system may be more likely to converge to an acceptable pre-distorted signal (e.g., pre-distorted signal 126, FIG. 1) than it would if the interference were not detected and mitigated. Detection and mitigation of significant interference (e.g., by interference detection and mitigation element 304) will now be described in more detail.

Figure 4:
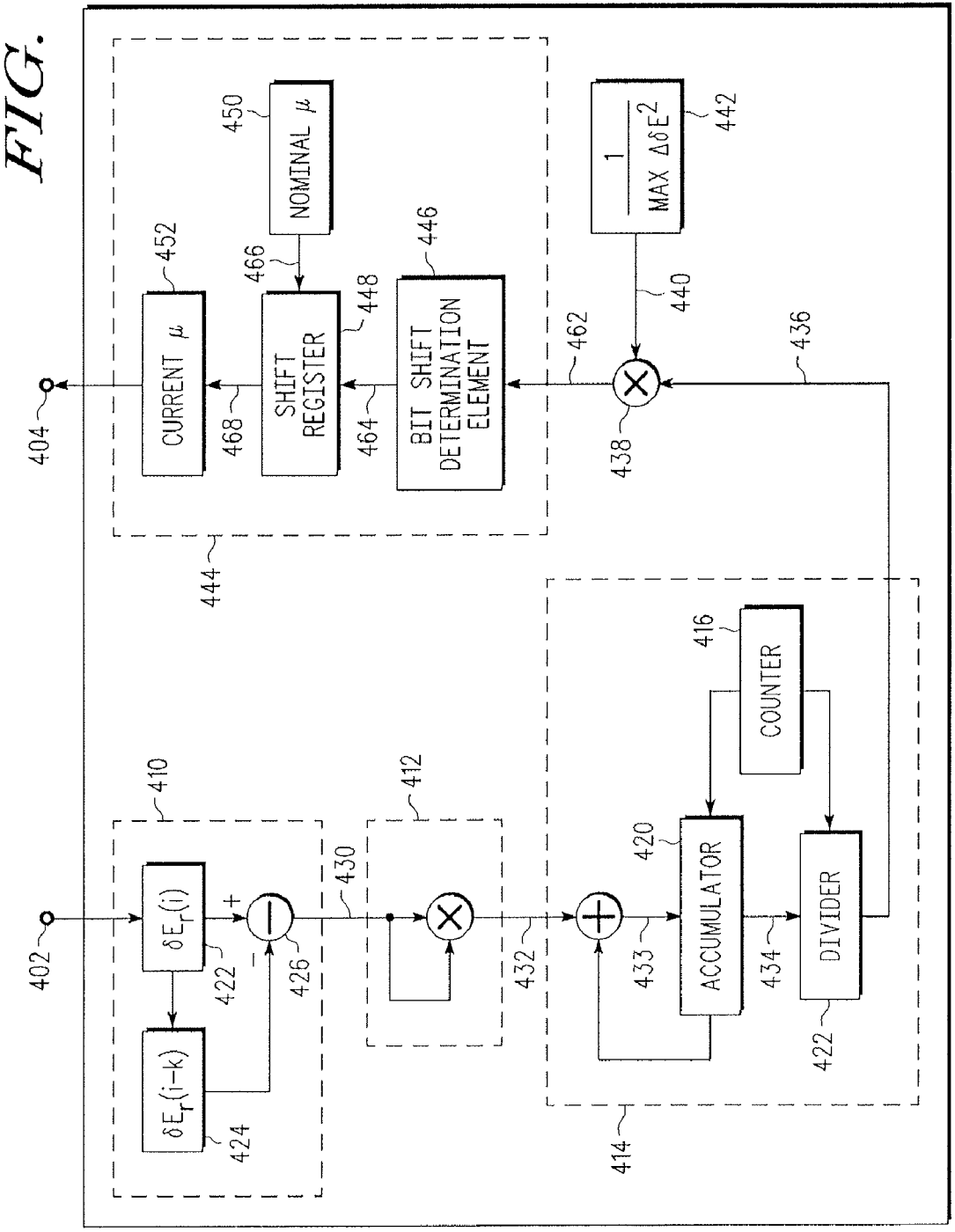
FIG. 4 illustrates a simplified block diagram of a interference detection and mitigation element, in accordance with an example embodiment.

FIG. 4 illustrates a simplified block diagram of an interference detection and mitigation element 400 (e.g., interference detection and mitigation element 304, FIG. 3), in accordance with an example embodiment. Interference detection and mitigation element 400 is adapted to receive difference indicators 402 (e.g., real components 327 or imaginary components 329 of error vectors 326, FIG. 3), which reflect differences between input samples and feedback samples, and to determine a signal to interference indicator 436, which is based on the difference indicators 402. Interference detection and mitigation element 400 is also adapted to mitigate the effect of interference on updated gain values (e.g., updated gain values 380, FIG. 3) by generating current adjustment factors 404 (e.g., current adjustment factors 328) that are inversely related to the signal to interference indicators 436.

In an embodiment, interference detection and mitigation element 400 is adapted to compare (or correlate) a current difference indicator 402 (represented herein as $\delta E_r(i)$) with a previous difference indicator (represented herein as $\delta E_r(i-k)$), and to generate a current adjustment factor 404 (e.g., current adjustment factor 328, FIG. 3) having a value that depends on the comparison (or correlation). In a particular embodiment, interference detection element 402 evaluates either real components or imaginary components of current and previous error vectors (e.g., error vectors 326, FIG. 3), referred to as difference indicators 402 and represented below as $\delta E_r(i)$ and $\delta E_r(i-k)$, during the process of determining whether significant interference is present. When a high correlation between the difference indicators 402 exists, this may indicate that no significant interfering signal is present in the feedback signal. Conversely, when a low correlation between the difference indicators 402 exists, this may indicate the onset of the presence of a significant interfering signal being reflected in the feedback signal.

In an embodiment, interference detection element 402 includes correlator 410, squaring element 412, and averaging element 414. Correlator 410 is adapted to calculate differences between at least two difference indicators 402 within a sequence of received difference indicators 402. In an embodiment, correlator 410 is adapted to correlate multiple difference indicators in order to generate a correlation value 430, which indicates the level of correlation between the difference indicators. In an embodiment, this includes calculating differences between two consecutive difference indicators 402 (e.g., k=1). In other embodiments, correlator 410 is adapted to correlate or calculate differences between non-consecutive difference indicators (e.g., k>1).

Correlator 410 includes a current difference indicator register 422, a previous difference indicator register 424, and difference calculator 426, in an embodiment. During initial priming of interference detection element 402, a first difference indicator 402 (e.g., $\delta E_r(i-k)$) is received and stored in current difference indicator register 422. Upon receipt of a second difference indicator 402 (e.g., $\delta E_r(i)$), the first difference indicator stored within the current difference indicator register 422 is moved to previous difference indicator register 424, and the second difference indicator 402 is stored in current difference indicator register 422. In the illustrated embodiment, the previous difference indicator register 422 includes a difference indicator that was received just prior to the difference indicator stored in the current difference indicator register 422 and, accordingly, k=1 in the illustrated embodiment. In embodiments in which k>1, additional registers may be included to store received difference indicators 402 between $\delta E_r(i)$ and $\delta E_r(i-k)$. Difference calculator 426 determines a correlation value 430, $\Delta\delta E(i)$, between the first difference indicator, $\delta E_r(i-k)$, stored in previous difference indicator register 424 and the second difference indicator, $\delta E_r(i)$, stored in current difference indicator register 422.

In an embodiment, the correlation value 430 is squared by squaring element 412, to generate a squared correlation value 432, $\Delta\delta E^2(i)$. Averaging element 414 is adapted to generate a signal to interference indicator 436, $<\Delta\delta E^2>$, which may represent an average of multiple ones of the squared correlation values 432 that it has received, including the squared correlation value 432 corresponding to the current difference indicator, $\delta E_r(i)$. In an embodiment, the number, m, of squared correlation values that averaging element 414 uses to compute the signal to interference indicator 436 is a pre-defined, integer number that is a factor of two (e.g., $m=2^x$, where x=1 . . . y, and y may be any integer in a range of 1 to 10, in an embodiment). In other embodiments, other numbers of squared correlation values (e.g., numbers that are not a factor of two) may be used to calculate the signal to interference indicator 436. An advantage to computing the signal to interference indicator 436 using a number of squared correlation values 432, m, that is a factor of two is that the averaging calculation can be performed, at least in part, by shifting bits to implement division by m, as will be described below. In an alternate embodiment, an average of multiple squared correlation values 432 is not computed, and instead the signal to interference indicator 436 is the same value as the squared correlation value 432, $\Delta\delta E^2(i)$ (e.g., averaging element 414 is excluded, or m=1).

In an embodiment, averaging element 414 includes a counter 416, an adder 418, an accumulator 420, and a divider 422. Counter 416 is adapted to provide a sample count, s, to accumulator 420 and divider 422. In an embodiment, counter 416 includes a register to store the current sample count, s, which is a value that is incremented by one for each received difference indicator 402. In an embodiment, counter 416 provides a sample count in a range from 1 to m (e.g., the register is reset to 1 after averaging element 414 has received and processed an $m^{th}$ sample). Accordingly, in an embodiment, counter 416 is a modulo m counter. In an alternate embodiment, counter 416 may provide a sample count in a range from 0 to m−1 or some other range.

Adder 418 is adapted to receive and add the squared correlation value 432, $\Delta\delta E^2(i)$, to a cumulative sum of multiple previous squared correlation values, which is stored within accumulator 420. Adder 418 generates a cumulative squared correlation value 433, which is stored in accumulator 420 (e.g., the previous cumulative squared correlation value within accumulator 420 is overwritten with the cumulative squared correlation value 433 generated by adder 418). Accumulator 420 is adapted to store the cumulative squared correlation value 433 until the sample count, s, received from counter 416 indicates that accumulator 420 has a stored cumulative sum of m squared correlation values 432. At that time, the cumulative value 434 stored within accumulator 420 is provided to divider 422, and the cumulative value stored within accumulator 420 may be reset (e.g., to zero).

Divider 422 is adapted to divide the cumulative value 434 by the number of squared differences, m, reflected in the cumulative value 434. In an embodiment in which m is a factor of two, divider 420 may include a shift register, which is adapted to right shift the bits of the cumulative value 434 by a value of $\log_2 m$. The signal to interference indicator 436, which is the output of divider 422, represents an average of m squared correlation values 432, in an embodiment. In other embodiments, the signal to interference indicator 436 may be calculated using other mathematical operations, which are functions of multiple received difference indicators 402 (e.g., correlations between multiple received difference indicators 402).

As mentioned previously, interference detection and mitigation element 400 is adapted to mitigate detected interference by adjusting the current adjustment factor 404 (e.g., current adjustment factor 328, FIG. 3) based on the signal to interference indicator 436. In an embodiment, the current adjustment factor 404 has a pre-defined, nominal adjustment factor value, or nominal μ, when no significant interference is detected. When significant interference is detected, the current adjustment factor 404 may be reduced below the nominal adjustment factor value by an amount that is related to the magnitude of the detected interference. In other words, the current adjustment factor 404 and the signal to interference indicator 436 have values that are inversely related to each other.

In order to detect significant interference and to adjust the current adjustment factor 404 accordingly, interference detection and mitigation element 400 includes a threshold comparator 438 and an adjustment factor calculation element 444, in an embodiment. Threshold comparator 438 receives and calculates a ratio value 462, which reflects a ratio between the signal to interference indicator 436 and a threshold signal to interference indicator 440, Co, where Co=1/(max $\Delta\delta E^2$), in an embodiment. The threshold signal to interference indicator 440 may be stored in a register or memory location 442. In an embodiment, threshold comparator 438 generates a ratio value 462 equal to <$\Delta\delta E^2$>×Co, or the ratio between the signal to interference indicator 436 and the threshold signal to interference indicator 440.

Adjustment factor calculation element 444 is adapted to calculate the current adjustment factor 404 based on a magnitude of ratio value 462. In an embodiment, adjustment factor calculation element 444 includes a bit shift determination element 446, a shift register 448, a nominal adjustment factor register or memory location 450, and a current adjustment factor register or memory location 452, in an embodiment. Bit shift determination element 444 receives ratio value 462, and based on a magnitude of ratio value 462, generates a bit shift value 464. In an embodiment, bit shift determination element 444 generates bit shift values 464 using a mapping process, although the bit shift value 464 could be generated in other ways (e.g., using additional comparisons or other mathematical operations), in other embodiments. In an embodiment that uses a mapping process to generate bit shift values 464, bit shift determination element 444 may include a mapping table having multiple records, where each record corresponds to a range of ratio values 462 and includes a bit shift value for that range. For example, bit shift determination element 444 may include a mapping table such as the following:

| ratio value (integer value) | bit shift value |
|---|---|
| 0 | 0 |
| 1 | 1 |
| 2-4 | 2 |
| 5-10 | 3 |
| 11-20 | 4 |
| ... | ... |

When bit shift determination element 444 receives a ratio value 462, the bit shift value within the record that corresponds to the ratio value 462 may be output as the bit shift value 464. The nominal adjustment factor 466 (e.g., nominal μ stored in nominal adjustment factor register or memory location 450) is loaded into shift register 448, and the nominal adjustment factor 466 is shifted (e.g., right shifted) by a number of bits corresponding to the received bit shift value 464. The resulting, modified adjustment factor 468, referred to herein as the current adjustment factor, is then stored in current adjustment factor register or memory location 452.

Although the above description uses a mapping process to determine a bit shift value 464, which in turn is used to calculate a current adjustment factor by bit-shifting the nominal adjustment factor 466, other ways of determining a current adjustment factor based on a signal to interference indicator (e.g., signal to interference indicator 436). For example, but not by way of limitation, a series of comparisons between the signal to interference indicator 436 and multiple threshold values may be performed, and a current adjustment factor may be calculated or selected based on those comparisons. In another embodiment, the mapping process may be performed based on the signal to interference indicator 436 (rather than the ratio value 462). In other words, each record of a mapping table may correspond to a range of signal to interference indicators 436 (rather than ratio values 462). In addition or alternatively, a mapping table used in the mapping process may include various adjustment factors (rather than bit shift values), any one of which may be selected as the current adjustment factor, depending on the value of the signal to interference indicator 436 (or a ratio value 462). Other ways of generating a current adjustment factor 404 may be contemplated, based on the description herein.

Referring also to FIG. 3, the current adjustment factor 328 (e.g., current adjustment factor 404, FIG. 4) may be received by combiner 306, as described previously, and combiner may combine the current adjustment factor 328 with an error vector 326, in order to generate an adjusted gain update value 330. When a current adjustment factor 328 having a value that is less than the nominal adjustment factor value is combined with an error vector 326, the magnitude of the resulting gain update value 330 will be less than it would be had the error vector 326 been combined with the nominal adjustment factor. Accordingly, when the resulting gain update value 330 is then combined with the corresponding delayed gain entries 332 (e.g., delayed LUT($n_{floor}$)(i) and delayed LUT($n_{ceil}$)(i)) to generate updated gain values 380, and the updated gain values 380 are used to update gain entries within the gain lookup table (e.g., gain lookup table 150, FIG. 1), the effect of the interference on the gain entries is mitigated (e.g., reduced). In other words, the interference is not reflected in the gain entries within the gain lookup table to the extent that it would have been if interference detection and mitigation were not performed, in accordance with an embodiment.

Figure 5:
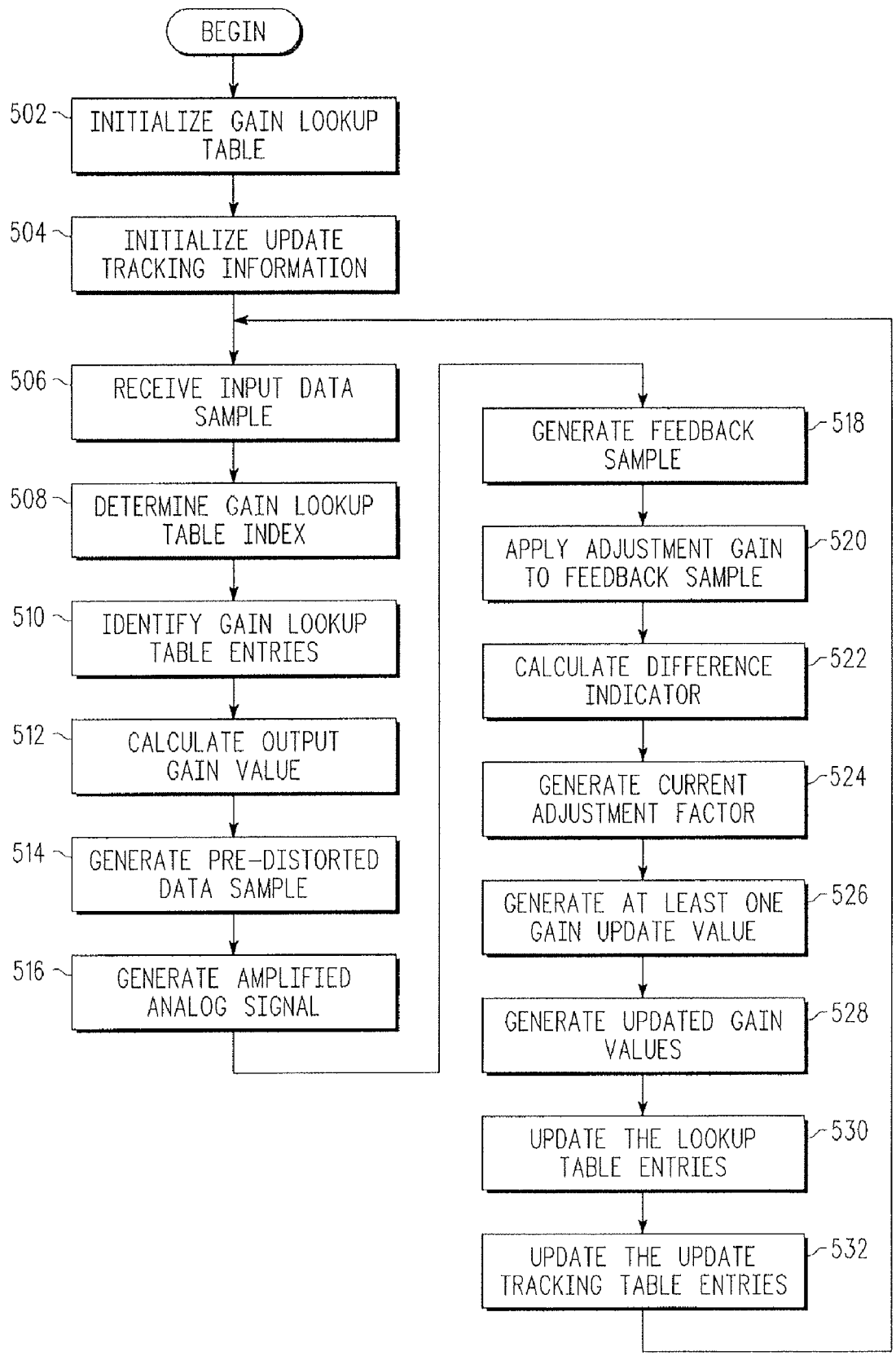
FIG. 5 illustrates a flowchart of a method for performing adaptive pre-distortion, in accordance with an example embodiment.

FIG. 5 illustrates a flowchart of a method for performing adaptive pre-distortion, in accordance with an example embodiment. The method may be performed by a transmitter of an electronic system (e.g., electronic system 100, FIG. 1), for example. The method begins, in block 502, by initializing the gain lookup table (e.g., gain lookup table 150, FIG. 1). In an embodiment, this includes writing an initial gain lookup table gain into at least some of the multiple gain lookup table entries, LUT(n). In an embodiment, the initial gain lookup table gain is a pre-defined gain, $G_{INITIAL}$. In an embodiment, $G_{INITIAL}$ may be a complex value represented by [$G_{INITIALr}$, $G_{INITIALi}$]. In an embodiment, each $G_{INITIAL}$=[1,0], or $G_{INITIALr}$=1 and $G_{INITIALi}$=0. In other embodiments, other initial values may be selected, and/or fewer than all gain lookup table entries may be set to initial values. In still another embodiment, none of the gain lookup table entries may be set to initial values, and any arbitrary values that may exist within the gain lookup table may simply be overwritten the first time the values are updated.

As mentioned previously in conjunction with the description of FIG. 1, a previous gain, G(previous), may be used in calculating an output gain value, G(i) (e.g., output gain value 124, FIG. 1), in an embodiment. In order to generate an initial value for the calculation, an initial previous gain value may be stored into a previous gain register (e.g., previous gain register 158, FIG. 1) and/or memory location. In an embodiment, the previous gain, G(previous), may be initialized to the same pre-defined, initial gain, $G_{INITIAL}$, or to a different pre-defined, initial gain. In an embodiment, the previous gain is set to an initial value of [1, 0]. In other embodiments, other initial values may be selected. In still other embodiments, previous gain values may not be used at all in calculating the output gain value, G(i).

In an embodiment, the system maintains update tracking information, which indicates whether or not each of the gain lookup table entries has been updated. The update tracking information is maintained in an update tracking table (e.g., UTT 152, FIG. 1), in an embodiment. In another embodiment, the update tracking information may be maintained in an update tracking field of each gain lookup table entry. In an embodiment, the update tracking information is initialized, in block 504. This may include, for example, writing initial values into the update tracking table entries, UTT(n). For example, each update tracking table entry may be set to an initial value that indicates that the corresponding gain lookup table entry has not yet been updated. In an embodiment, each update tracking table entry is set to an initial value of 0. In other embodiments, other initial values may be selected.

For example, in an embodiment, blocks 502 and 504 may be implemented according to the following sequence:

```
for p = 1:N
    LUT(p) = [1, 0]
    UTT(p) = 0
end
```

In block 506, an input sample, X(i), (e.g., input sample 114, FIG. 1) is received, stored, and/or delayed (e.g., by delay element 120 and/or delay element 144, FIG. 1) for later access. In addition, a gain lookup table index (e.g., gain lookup table index 160) for the received input sample is determined, in block 508. In an embodiment, the gain lookup table index, i(i), is a function of the received input sample, or i(i)=f{X(i)}=f{I(i)+jQ(i)}, as described previously. In an embodiment, the gain lookup table index, i(i), is provided to a gain generator (e.g., gain generator 142, FIG. 1), as well as being stored and/or delayed (e.g., by delay element 144, FIG. 1) for later access.

In block 510, two, consecutive gain lookup table entries, LUT($n_{floor}$) and LUT($n_{ceil}$), are identified based on the input sample, X(i), or more specifically, based on the gain lookup table index, i(i). In addition, in block 512, an output gain, G(i), is calculated by performing a weighted interpolation process, as mentioned previously. The factional part, $i_{FRAC}$(i), of the gain lookup table index, i(i), may used to determine a weighting to apply to each of the two, consecutive gain lookup table entries, LUT($n_{floor}$) and LUT($n_{ceil}$), during the interpolation process. In an embodiment, the output gain, G(i), may be determined as:

$$G(i)=w_1(LUT(n_{floor}))+w_2(LUT(n_{ceil})),$$

where $w_1=1-i_{FRAC}(i)$ and $w_2=i_{FRAC}(i)$. During a first iteration of the method, LUT($n_{floor}$) and/or LUT($n_{ceil}$) may be the initial gains that were stored in block 502.

For example, assume that a gain lookup table (e.g., gain lookup table 150, FIG. 1) includes eight entries, n=1 . . . 8. Referring also to FIG. 2, each of eight magnitude thresholds 211, 212, 213, 214, 215, 216, 217, 218 may correspond to one of the eight entries in the gain lookup table. For example, a first magnitude threshold 211 may correspond to LUT(1), a second magnitude threshold 212 may correspond to LUT(2), and so on. In the illustrated example, at least the first five samples 210 have magnitudes that fall between the first and second magnitude thresholds 211, 212. Accordingly, for the first five samples 210, a gain lookup table gain may be based on an interpolation between the first and second gain lookup table entries, or LUT($n_{floor}$)=LUT(1) and LUT($n_{ceil}$)=LUT(2).

As mentioned previously, a previous gain value, G(previous), may be used in calculating an output gain, G(i), in an alternate embodiment. In such an embodiment, a weighted interpolation process may be performed to generate the output gain, G(i). For example, the output gain, G(i), may be determined as:

$$G(i)=w_1*A+w_2*B,$$

where $w_1=1-i_{FRAC}(i)$ and $w_2=i_{FRAC}(i)$. In an embodiment, a determination may be made whether at least one of the consecutive gain lookup table entries has not been updated, and if so, a previous gain, G(previous), may be used as at least one argument in the weighted interpolation process. For example, in an embodiment, when UTT($n_{floor}$) indicates that LUT($n_{floor}$) has been previously updated (e.g., UTT($n_{floor}$)>0), then A=LUT($n_{floor}$). Conversely, when UTT($n_{floor}$) indicates that LUT($n_{floor}$) has not previously been updated (e.g., UTT($n_{floor}$)=0), then A=G(previous), in an embodiment. Similarly, when UTT($n_{ceil}$) indicates that LUT($n_{ceil}$) has been previously updated (e.g., UTT($n_{ceil}$)>0), then B=LUT($n_{ceil}$). Conversely, when UTT($n_{ceil}$) indicates that LUT($n_{ceil}$) has not previously been updated (e.g., UTT($n_{ceil}$)=0), then B=G(previous), in an embodiment.

In an embodiment in which G(previous) is maintained, the calculated output gain, G(i), may be stored as the previous gain, G(previous), by writing the output gain into the previous gain register (e.g., previous gain register 158, FIG. 1) or the memory location that stores G(previous), in an embodiment. In other words, G(previous) may be set to G(i). In an alternate embodiment, the previous gain register may store a value that is calculated from a combination of previous gains. In such an embodiment, G(previous) may be calculated using the output gain, G(i), and one or more other previous gains.

As discussed above, the output gain, G(i), may be stored as the previous gain, G(previous), by writing the output gain into the previous gain register, or G(previous)=G(i). In another embodiment, a value that is a function of the new values for the gain lookup table entries LUT($n_{floor}$) and LUT($n_{ceil}$) is written into the previous gain register (e.g., previous gain register 158, FIG. 1). For example, in an embodiment, G(previous) may be determined as:

$$G(previous)=w_1(LUT(n_{floor}))+w_2(LUT(n_{ceil})),$$

where $w_1=1-i_{FRAC}(i)$ and $w_2=i_{FRAC}(i)$. In still other embodiments, G(previous) may not be maintained.

In block 514, the stored or delayed input sample, X(i), and the output gain, G(i), generated in block 512 are combined to generate a pre-distorted data sample (e.g., pre-distorted data sample 126, FIG. 1). The pre-distorted data sample, $X_p(i)$, may then be D-to-A converted, up-converted, and amplified, in block 516, to generate an amplified analog signal (e.g., amplified analog signal 132, FIG. 1) that may be further processed, stored, and/or provided to an antenna (e.g., antenna 133, FIG. 1).

In block 518, the antenna output signal (e.g., antenna output signal 135, FIG. 1, which includes the amplified analog signal, and which also may include interference) may be fed back (e.g., via feedback loop 108, FIG. 1), down-converted, and A-to-D converted (e.g., by down-converter 110, FIG. 1), to generate a feedback sample, $X_d(i)$ (e.g., feedback sample 136, FIG. 1). Accordingly, the feedback sample corresponds to a digitized representation of the antenna output signal. In block 520, an adjustment gain may be applied to the feedback sample (e.g., feedback sample 136, FIG. 1). For example, as discussed previously, the adjustment gain and the feedback sample may be multiplied together (e.g., by gain adjustment element 146, FIG. 1), to generate an adjusted feedback sample (e.g., adjusted feedback sample 138, FIG. 1).

In blocks 522-528, updated gain values (e.g., updated gain values 180, FIG. 1 or 380, FIG. 3) are generated, as described previously, in accordance with various embodiments. More specifically, in block 522, a difference indicator (e.g., error vector 326) is calculated, which reflects differences between the delayed input sample (e.g., delayed input sample 147, FIG. 1 or 320, FIG. 3) and the corresponding feedback sample (e.g., feedback sample 138, FIG. 1 or 322, FIG. 3). In block 524, a current adjustment factor (e.g., current adjustment factor 328, FIG. 3 or 404, FIG. 4) is generated. In an embodiment, this may include determining a signal to interference indicator (e.g., signal to interference indicator 436, FIG. 4), which is based on at least a current and a previous difference indicator (e.g., difference indicators 402, FIG. 4). The current adjustment factor may be generated by reducing a nominal adjustment factor by an amount that is inversely related to a comparison between the signal to interference indicator and a threshold signal to interference indicator, as discussed previously.

In block 526, at least one gain update value (e.g., gain update values 330, FIG. 3) is generated by combining the error vector (e.g., error vector 326, FIG. 3) with the current adjustment factor (e.g., current adjustment factor 328, FIG. 3). In block 528, updated gain values (e.g., updated gain values 180, FIG. 1 or 380, FIG. 3) are generated by combining the at least one gain update value with at least one current value for at least one gain entry, where the at least one gain entry corresponds to the at least one gain entry (e.g., LUT($n_{floor}$)(i) and LUT($n_{ceil}$)(i)) that was used to calculate the gain value (e.g., gain value 124, FIG. 1) that was combined with the input sample (e.g., delayed input sample 115, FIG. 1).

In block 530, the gain entries within the gain lookup table and the update tracking table entries may be updated. In an embodiment, LUT($n_{floor}$) and LUT($n_{ceil}$) are updated with the updated gain values calculated in block 526. The update tracking information within the update tracking table entries, UTT($n_{floor}$) and UTT($n_{ceil}$) also may be updated in block 532, in an embodiment, to indicate that the gain lookup table entries, LUT($n_{floor}$) and LUT($n_{ceil}$), have been updated. For example, in an embodiment, the values within UTT($n_{floor}$) and UTT($n_{ceil}$) may be incremented by one. In another embodiment, when the update tracking table includes simple Boolean values, the values within UTT($n_{floor}$) and UTT($n_{ceil}$) may be modified simply to indicate that at least one update has occurred, if they have not already been so modified.

In an embodiment, one or more gain lookup table entries that are considered to be "adjacent" to $LUT_{floor}(i)$ and/or $LUT_{ceil}(i)$ also may be updated, under certain circumstances. To update adjacent gain lookup table entries, a determination may be made whether any one or more gain lookup table entries that are considered to be "adjacent" to $LUT_{floor}(i)$ and/or $LUT_{ceil}(i)$ have not been updated, in an embodiment. For example, in an embodiment, "adjacent" gain lookup table entries to $LUT_{floor}(i)$ may include one or more (e.g., up to all) gain lookup table entries having lower indices into the gain lookup table, and "adjacent" gain lookup table entries to $LUT_{ceil}(i)$ may include one or more (e.g., up to all) gain lookup table entries having higher indices into the gain lookup table. In an embodiment, a determination of whether or not a particular, adjacent gain lookup table entry, LUT(n), has been updated may be determined by evaluating the update tracking information within the corresponding entry within the update tracking table, UTT(n). For example, UTT(n) may include a value that indicates whether or not LUT(n) has been updated, as discussed previously. When one or more adjacent gain lookup table entries have not been updated, then the updated gains, LUT($n_{floor}$) and/or LUT($n_{ceil}$), may be written into at least some of the one or more, non-updated, adjacent gain lookup table entries. In another embodiment, the updated gains may be written into one or more adjacent gain lookup table entries that have been updated fewer than some threshold number of times.

In an embodiment, completion of block 532 completes the process of updating the gain lookup table and update tracking table for X(i). The method may then iterate, as shown, for subsequent input samples.

It is to be understood that certain ones of the process blocks depicted in FIG. 5 may be performed in parallel with each other for a particular sample, X(i), and also in parallel with performing these processes for previous or subsequent samples. In addition, it is to be understood that the particular ordering of the process blocks depicted in FIG. 5 may be modified, while achieving substantially the same result. Further, embodiments described in conjunction with FIG. 5 may be combined into a particular embodiment. Accordingly, such modifications are intended to be included within the scope of the inventive subject matter.

Embodiments may include one or more additional or different processes and/or features. For example, although it may be advantageous to use embodiments described herein, and variations thereof, in systems that use actual data in conjunction with initially updating a gain lookup table, embodiments alternatively may be used in conjunction with systems that use training sequences to initially update the gain lookup table.

Embodiments described above have discussed signal processing based on values represented in Cartesian coordinates. Accordingly, digital signal processing carried out by the system may be performed using techniques appropriate for Cartesian coordinate calculations. In other embodiments, some values may be represented in polar coordinates or using other representations. It is to be understood that the scope of the inventive subject matter is intended to include embodiments in which digital signal processing carried out by the system may be performed using techniques appropriate for polar coordinate calculations or other types of calculations. Embodiments may include other modifications, as well.

Thus, various embodiments of adaptive pre-distortion methods and apparatus have been described. An embodiment includes a method for performing adaptive pre-distortion in an electronic system that includes a transmitter and an antenna. The method is performed by the transmitter and includes the step of combining an input sample with a gain value to generate a pre-distorted data sample, where the gain value is a function of at least one gain entry stored within a gain lookup table. The method also includes the steps of generating an amplified analog signal from the pre-distorted data sample, and generating a feedback sample, which corresponds to a digitized representation of an antenna output signal, where the antenna output signal includes the amplified analog signal. An embodiment of the method also includes the steps of generating a difference indicator, which reflects a difference between the input sample and the feedback sample, and generating at least one updated gain value based on a comparison between the difference indicator and at least one previous difference indicator, where the at least one previous difference indicator reflects a difference between at least one previous input sample and at least one previous feedback sample. The method also includes the step of updating the at least one gain entry within the gain lookup table with the at least one updated gain value.

Another embodiment includes an apparatus adapted to pre-distort an input signal. The apparatus includes a gain generator adapted to generate a gain value as a function of at least one gain entry stored within a gain lookup table, and a combiner, operatively coupled to the gain generator, adapted to combine an input sample with the gain value to generate a pre-distorted data sample. The apparatus also includes an amplifier, operatively coupled to the combiner, adapted to generate an amplified analog signal based on the pre-distorted sample, and a feedback path, operatively coupled to the amplifier, adapted to generate a feedback sample, which corresponds to a digitized representation of an antenna output signal, where the antenna output signal includes the amplified analog signal. An embodiment of the apparatus also includes a gain entry updating element adapted to generate a difference indicator, which reflects a difference between the input sample and the feedback sample, and to generate at least one updated gain value based on a comparison between the difference indicator and at least one previous difference indicator, where the at least one previous difference indicator reflects a difference between at least one previous input sample and at least one previous feedback sample, and to update the at least one gain entry within the gain lookup table with the at least one updated gain value.

Yet another embodiment includes an electronic system that includes an antenna and a transmitter, operatively coupled to the antenna. The transmitter includes a gain generator adapted to generate a gain value as a function of at least one gain entry stored within a gain lookup table, a combiner, operatively coupled to the gain generator, adapted to combine an input sample with the gain value to generate a pre-distorted data sample, and an amplifier, operatively coupled to the combiner, adapted to generate an amplified analog signal based on the pre-distorted sample. The transmitter also includes a feedback path, operatively coupled to the amplifier, adapted to generate a feedback sample, which corresponds to a digitized representation of an antenna output signal, where the antenna output signal includes the amplified analog signal. An embodiment of the electronic system also includes a gain entry updating element adapted to generate a difference indicator, which reflects a difference between the input sample and the feedback sample, and to generate at least one updated gain value based on a comparison between the difference indicator and at least one previous difference indicator, where the at least one previous difference indicator reflects a difference between at least one previous input sample and at least one previous feedback sample, and to update the at least one gain entry within the gain lookup table with the at least one updated gain value.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for performing adaptive pre-distortion in an electronic system that includes a transmitter and an antenna, the method performed by the transmitter and comprising the steps of:

combining an input sample with a gain value to generate a pre-distorted data sample, wherein the gain value is a function of at least one gain entry stored within a gain lookup table;

generating an amplified analog signal from the pre-distorted data sample;

generating a feedback sample, which corresponds to a digitized representation of an antenna output signal, wherein the antenna output signal includes the amplified analog signal;

generating a difference indicator, which reflects a difference between the input sample and the feedback sample;
generating at least one updated gain value based on a comparison between the difference indicator and at least one previous difference indicator, wherein the at least one previous difference indicator reflects a difference between at least one previous input sample and at least one previous feedback sample; and
updating the at least one gain entry within the gain lookup table with the at least one updated gain value.

2. The method of claim 1, wherein the at least one gain entry includes two adjacent gain entries within the gain lookup table, and wherein the gain value is a value between the two adjacent gain entries.

3. The method of claim 1, wherein generating the feedback sample comprises:
down-converting a feedback signal that represents the antenna output signal to generate a down-converted feedback signal; and
performing an analog-to-digital conversion of the down-converted feedback signal to generate the feedback sample.

4. The method of claim 1, wherein generating the feedback sample comprises:
down-converting a feedback signal that represents the antenna output signal to generate a down-converted feedback signal;
performing an analog-to-digital conversion of the down-converted feedback signal to generate a first feedback sample; and
applying an adjustment gain to the first feedback sample to generate the feedback sample.

5. A method for performing adaptive pre-distortion in an electronic system that includes a transmitter and an antenna, the method performed by the transmitter and comprising the steps of:
combining an input sample with a gain value to generate a pre-distorted data sample, wherein the gain value is a function of at least one gain entry stored within a gain lookup table;
generating an amplified analog signal from the pre-distorted data sample;
generating a feedback sample, which corresponds to a digitized representation of an antenna output signal, wherein the antenna output signal includes the amplified analog signal;
generating a difference indicator, which reflects a difference between the input sample and the feedback sample, by generating an error vector as the difference indicator, wherein the error vector includes a real component and an imaginary component, and wherein the real component of the error vector includes a difference between a real component of the input sample and a real component of the feedback sample, and wherein the imaginary component of the error vector includes a difference between an imaginary component of the input sample and an imaginary component of the feedback sample;
generating at least one updated gain value based on a comparison between the difference indicator and at least one previous difference indicator, wherein the at least one previous difference indicator reflects a difference between at least one previous input sample and at least one previous feedback sample; and
updating the at least one gain entry within the gain lookup table with the at least one updated gain value.

6. A method for performing adaptive pre-distortion in an electronic system that includes a transmitter and an antenna, the method performed by the transmitter and comprising the steps of:
combining an input sample with a gain value to generate a pre-distorted data sample, wherein the gain value is a function of at least one gain entry stored within a gain lookup table;
generating an amplified analog signal from the pre-distorted data sample;
generating a feedback sample, which corresponds to a digitized representation of an antenna output signal, wherein the antenna output signal includes the amplified analog signal;
generating a difference indicator, which reflects a difference between the input sample and the feedback sample, by generating an error vector as the difference indicator, wherein the error vector includes a magnitude component and a phase component, and wherein the magnitude component of the error vector includes a difference between a magnitude component of the input sample and a magnitude component of the feedback sample, and wherein the phase component of the error vector includes a difference between a phase component of the input sample and a phase component of the feedback sample;
generating at least one updated gain value based on a comparison between the difference indicator and at least one previous difference indicator, wherein the at least one previous difference indicator reflects a difference between at least one previous input sample and at least one previous feedback sample; and
updating the at least one gain entry within the gain lookup table with the at least one updated gain value.

7. A method for performing adaptive pre-distortion in an electronic system that includes a transmitter and an antenna, the method performed by the transmitter and comprising the steps of:
combining an input sample with a gain value to generate a pre-distorted data sample, wherein the gain value is a function of at least one gain entry stored within a gain lookup table;
generating an amplified analog signal from the pre-distorted data sample;
generating a feedback sample, which corresponds to a digitized representation of an antenna output signal, wherein the antenna output signal includes the amplified analog signal;
generating a difference indicator, which reflects a difference between the input sample and the feedback sample;
generating at least one updated gain value based on a comparison between the difference indicator and at least one previous difference indicator, wherein the at least one previous difference indicator reflects a difference between at least one previous input sample and at least one previous feedback sample, wherein the at least one updated gain value is generated by
generating a signal to interference indicator as a function of the difference indicator and the at least one previous difference indicator,
generating a current adjustment factor based on the signal to interference indicator, and
generating the at least one updated gain value based on the current adjustment factor; and
updating the at least one gain entry within the gain lookup table with the at least one updated gain value.

8. The method of claim 7, wherein generating the signal to interference indicator comprises:
calculating a correlation value, which represents a difference between the difference indicator and the at least one previous difference indicator, wherein the at least one previous difference indicator was received just prior to the difference indicator;
squaring the correlation value to generate a squared correlation value;
adding the squared correlation value to a cumulative sum of squared correlation values; and
when the cumulative sum includes a pre-defined number of squared correlation values, dividing the cumulative sum by the pre-defined number to generate the signal to interference indicator.

9. The method of claim 7, wherein generating the current adjustment factor further comprises:
calculating a ratio value, which reflects a ratio between the signal to interference indicator and a threshold signal to interference indicator; and
calculating the current adjustment factor based on the ratio value.

10. The method of claim 7, wherein generating the current adjustment factor further comprises:
reducing a nominal adjustment factor by an amount that is based on the signal to interference indicator.

11. The method of claim 10, wherein reducing the nominal adjustment factor comprises:
determining a bit shift value based on the signal to interference indicator; and
right shifting the nominal adjustment factor by the bit shift value to generate the current adjustment factor.

12. A method for performing adaptive pre-distortion in an electronic system that includes a transmitter and an antenna, the method performed by the transmitter and comprising the steps of:
combining an input sample with a gain value to generate a pre-distorted data sample, wherein the gain value is a function of at least one gain entry stored within a gain lookup table;
generating an amplified analog signal from the pre-distorted data sample by
performing a digital-to-analog conversion of the pre-distorted data sample to generate an analog version of the pre-distorted data sample,
up-converting the analog version to generate an up-converted analog signal, and
amplifying the up-converted analog signal to generate the amplified analog signal;
generating a feedback sample, which corresponds to a digitized representation of an antenna output signal, wherein the antenna output signal includes the amplified analog signal;
generating a difference indicator, which reflects a difference between the input sample and the feedback sample;
generating at least one updated gain value based on a comparison between the difference indicator and at least one previous difference indicator, wherein the at least one previous difference indicator reflects a difference between at least one previous input sample and at least one previous feedback sample; and
updating the at least one gain entry within the gain lookup table with the at least one updated gain value.

13. A method for performing adaptive pre-distortion in an electronic system that includes a transmitter and an antenna, the method performed by the transmitter and comprising the steps of:
combining an input sample with a gain value to generate a pre-distorted data sample, wherein the gain value is a function of at least one gain entry stored within a gain lookup table;
generating an amplified analog signal from the pre-distorted data sample;
generating a feedback sample, which corresponds to a digitized representation of an antenna output signal, wherein the antenna output signal includes the amplified analog signal, and the feedback signal is generated by
down-converting a feedback signal that represents the antenna output signal to generate a down-converted feedback signal,
performing an analog-to-digital conversion of the down-converted feedback signal to generate a first feedback sample,
applying a phase rotation to the adjustment gain, prior to applying an adjustment gain to the first feedback sample, and
applying the adjustment gain to the first feedback sample to generate the feedback sample;
generating a difference indicator, which reflects a difference between the input sample and the feedback sample;
generating at least one updated gain value based on a comparison between the difference indicator and at least one previous difference indicator, wherein the at least one previous difference indicator reflects a difference between at least one previous input sample and at least one previous feedback sample; and
updating the at least one gain entry within the gain lookup table with the at least one updated gain value.

14. An apparatus adapted to pre-distort an input signal, the apparatus comprising:
a gain generator adapted to generate a gain value as a function of at least one gain entry stored within a gain lookup table;
a combiner, operatively coupled to the gain generator, adapted to combine an input sample with the gain value to generate a pre-distorted data sample;
an amplifier, operatively coupled to the combiner, adapted to generate an amplified analog signal based on the pre-distorted sample;
a feedback path, operatively coupled to the amplifier, adapted to generate a feedback sample, which corresponds to a digitized representation of an antenna output signal, wherein the antenna output signal includes the amplified analog signal; and
a gain entry updating element adapted to
generate a difference indicator, which reflects a difference between the input sample and the feedback sample, and
generate at least one updated gain value based on a comparison between the difference indicator and at least one previous difference indicator, wherein the at least one previous difference indicator reflects a difference between at least one previous input sample and at least one previous feedback sample, and
update the at least one gain entry within the gain lookup table with the at least one updated gain value.

15. The apparatus of claim 14, wherein the gain entry updating element comprises:
an error vector calculator adapted to generate an error vector as the difference indicator;
an interference detection and mitigation element adapted to generate the current adjustment factor;
a combiner adapted to combine the error vector and a current adjustment factor to generate gain update values, wherein the current adjustment factor is generated based on the comparison between the difference indicator and at least one previous difference indicator; and an updated gain value calculator adapted to combine the gain update values with at least one current value for the at least one gain entry in order to generate the at least one updated gain value.

16. The apparatus of claim 14, further comprising:

a digital-to-analog converter adapted to perform a digital-to-analog conversion of the pre-distorted data sample to generate an analog version of the pre-distorted data sample; and an up-converter adapted to up-convert the analog version to generate an up-converted analog signal, wherein the amplifier amplifies the up-converted analog signal to generate the amplified analog signal.

17. The apparatus of claim 14, wherein the feedback path comprises:

a down-converter adapted to down-convert a feedback signal that represents the antenna output signal to generate a down-converted feedback signal;

an analog-to-digital converter adapted to perform an analog-to-digital conversion of the down-converted feedback signal to generate a first feedback sample; and a gain adjustment element adapted to apply an adjustment gain to the first feedback sample to generate the feedback sample.

18. An electronic system comprising:

an antenna; and a transmitter, operatively coupled to the antenna, wherein the transmitter includes a gain generator adapted to generate a gain value as a function of at least one gain entry stored within a gain lookup table, a combiner, operatively coupled to the gain generator, adapted to combine an input sample with the gain value to generate a pre-distorted data sample, an amplifier, operatively coupled to the combiner, adapted to generate an amplified analog signal based on the pre-distorted sample, a feedback path, operatively coupled to the amplifier, adapted to generate a feedback sample, which corresponds to a digitized representation of an antenna output signal, wherein the antenna output signal includes the amplified analog signal, and a gain entry updating element adapted to generate a difference indicator, which reflects a difference between the input sample and the feedback sample, and generate at least one updated gain value based on a comparison between the difference indicator and at least one previous difference indicator, wherein the at least one previous difference indicator reflects a difference between at least one previous input sample and at least one previous feedback sample, and update the at least one gain entry within the gain lookup table with the at least one updated gain value.

19. The electronic system of claim 18, wherein the transmitter further comprises:

a digital-to-analog converter adapted to perform a digital-to-analog conversion of the pre-distorted data sample to generate an analog version of the pre-distorted data sample;

an up-converter adapted to up-convert the analog version to generate an up-converted analog signal, wherein the amplifier amplifies the up-converted analog signal to generate the amplified analog signal;

a down-converter adapted to down-convert a feedback signal that represents the antenna output signal to generate a down-converted feedback signal;

an analog-to-digital converter adapted to perform an analog-to-digital conversion of the down-converted feedback signal to generate a first feedback sample; and a gain adjustment element adapted to apply an adjustment gain to the first feedback sample to generate the feedback sample.

20. The electronic system of claim 18, wherein the electronic system is a type of system selected from a group of systems that includes a cellular telephone, a radio, a two-way pager, a personal data assistant, a computer, a satellite, a relay, a repeater, a remote control device, a wireless transmitter, and a wireless transceiver.

* * * * *